United States Patent [19]
Barbour et al.

[11] Patent Number: 5,849,373
[45] Date of Patent: Dec. 15, 1998

[54] PROCESS FOR THE SYNTHESIS OF NANOPHASE DISPERSION-STRENGTHENED ALUMINUM ALLOY

[75] Inventors: John C. Barbour; James Arthur Knapp; David Martin Follstaedt; Samuel Maxwell Myers, all of Albuquerque, N. Mex.

[73] Assignee: Sandia Corporation, Albuquerque, N. Mex.

[21] Appl. No.: 895,543

[22] Filed: Jul. 17, 1997

Related U.S. Application Data

[63] Continuation of Ser. No. 598,781, Feb. 5, 1996, abandoned.
[51] Int. Cl.$^6$ ........................................................ H05H 1/24
[52] U.S. Cl. ........................ 427/576; 427/569; 427/126.3
[58] Field of Search ..................................... 427/576, 569, 427/126.3

[56] References Cited

U.S. PATENT DOCUMENTS

| | | | |
|---|---|---|---|
| 5,028,306 | 7/1991 | Davis et al. | 204/192.15 |
| 5,032,193 | 7/1991 | Ovshinsky et al. | 148/242 |
| 5,182,495 | 1/1993 | Fukuda et al. | 315/111.41 |

*Primary Examiner*—Benjamin Utech

[57] ABSTRACT

A process for fabricating dispersion-strengthened ceramic-metal composites is claimed. The process comprises in-situ interaction and chemical reaction of a metal in gaseous form with a ceramic producer in plasma form. Such composites can be fabricated with macroscopic dimensions. Special emphasis is placed on fabrication of dispersion-strengthened aluminum oxide-aluminum composites, which can exhibit flow stresses more characteristic of high strength steel.

15 Claims, No Drawings

PROCESS FOR THE SYNTHESIS OF NANOPHASE DISPERSION-STRENGTHENED ALUMINUM ALLOY

This application is a continuation of application Ser. No. 08/598,781, filed Feb. 5, 1996, now abandoned.

GOVERNMENT RIGHTS

The U.S. Government has a paid-up license to this invention and the right in limited circumstances to require the patent owner to license others on reasonable terms.

BACKGROUND OF THE INVENTION

1. Field of the Invention (Technical Field)

The present invention relates to methods for production of nanophase dispersion-strengthened materials, including plasma-based processes which produce a wide range of products, including thin layers and complete articles made of a composite comprising metal and metal-ceramic particles.

2. Background Art

Aluminum alloys are used in numerous commercial and industrial applications requiring high strength and light weight. Their range of applicability, however, is often limited by their limited tribological properties. Much effort, therefore, has gone into the development and deposition of hard, wear-resistant coatings to extend the use of Al alloys.

High strength has recently been achieved for aluminum-oxygen alloy films of varying stoichiometries and microstructure ranging from hard, dispersion-strengthened layers to $Al_2O_3$ layers that are expected to be hard and resistant.

Dispersion-strengthened $AlO_x$ layers are comprised of an fcc Al matrix containing finely dispersed $\gamma$-$Al_2O_3$ precipitates (nanophase precipitates) which strengthen the film by blocking dislocation motion. (The $AlO_x$ nomenclature arises as an attempt to stress the non-stoichiometric nature of the film as a whole.) The yield stress in such a film is approximately given by 2 Gb/L, where G is the shear modulus of the Al matrix, b is the Burgers vector of the dislocations, and L is the inter-particle spacing. Thus, as precipitate density increases, L decreases, and the yield stress increases.

Such materials have been synthesized in the past, primarily using sintering, but these materials have low precipitate density and large precipitates. Such sintered materials hence do not exhibit the strengths achieved by materials produced using the new method described in this patent. Another method is ion implantation of O into Al to produce nanophase $Al_2O_3$ in the Al matrix. (The term nanophase is defined here as a nanometer-size cluster embedded in a matrix, wherein said cluster is composed of a different material than the surrounding matrix. An example of this usage is to refer to the nanometer-size $Al_2O_3$ precipitates in an Al matrix as nanophase $Al_2O_3$.) However, the thickness of dispersion-strengthened layer which can be produced using implantation is limited to the depth of ion implantation (typically less than 1 $\mu$). Such ion-implanted layers exhibit yield stress of as high as 2.9 GPa, which is much greater that the yield stress for conventional high-strength aerospace alloys such as 7075 Al, which has a yield stress of 0.5 GPa. This factor of six increase in strength, and the corresponding decrease in friction and wear exhibited by O-implanted Al, suggests a host of potential uses. However, practical use of this ion implantation-based synthesis technique is restricted by high cost and the limitation of the thickness of the final film to ~1 $\mu$ or less.

SUMMARY OF THE INVENTION

It is an object of the present invention to provide a method for manufacture of dispersion-strengthened Al-O alloys, where said alloys have flow stresses approaching those of high strength steel, and said alloys comprise a continuous Al matrix containing nanophase particles with a nominal composition of $Al_2O_3$.

Another object of the present invention is to provide such a technique having properties compatible with large-scale commercial application of dispersion-strengthened Al-O alloys.

Yet another object of the present invention is to provide a method for making objects comprising dispersion-strengthened Al-O alloys with a thickness reatly in excess of 1 $\mu$.

Still another object of the present invention is to provide a method for synthesizing dispersion-strengthened Al-O alloys which exhibit high strength at elevated temperatures.

It is also an object of the present invention to provide a method for manufacture of dispersion-strengthened Al-O alloy layers having greatly reduced friction and wear relative to Al and currently existing Al alloys.

These and other objects are achieved by providing a method of producing a composite material, comprising a continuous metallic matrix containing a fine dispersion of nanophase precipitates. In one set of implementations, the continuous metallic matrix comprises Al and the nanoscale precipitates have a nominal composition of $Al_2O_3$. This is accomplished by using deposition techniques which include a plasma-based step. These techniques include Pulsed Laser Deposition (PLD) and conventional deposition in the presence of an oxygen plasma source, such as an Electron Cyclotron Resonance (ECR) plasma.

DETAILED DESCRIPTION

The present invention is based on supplying simultaneous fluxes of Al and O atoms, with excess excitation energy, impinging on a growth surface. (The choice of Al and O atoms are a specific implementation, not intended to limit the scope of the present invention.) The effect is to causing growth of nanophase precipitates having a nominal composition of $Al_2O_3$ within an Al matrix. These precipitates will have a size and separation which depends largely on the nominal composition and the growth rate of the growing film. Growth in the presence of an energetic plasma has been found to be effective to form such materials.

The desired effect, that of strengthening the material being grown by introducing precipitates into the basic matrix of the material, is most significant for a very dense dispersion of small precipitates (a rather narrow range of composite structures). Dispersion strengthening can only be effective if the particles are spaced closely enough, and have the size and strength to pin the dislocations locally, so that further yielding forces the growth of large loops of dislocation. In a simple approximation, the yield stress in a material containing particles capable of pinning dislocations is approximately 2 Gb/L, where G is the shear modulus of the matrix, b is the Burgers vector of the dislocation, and L is the separation between the particles. A conventional high strength aerospace Al alloy will have a yield stress of about 0.5 GPa, whereas a dispersion-strengthened Al film can have a yield stress up to about 5.0 GPa. The 5.0 GPa figure suggests a particle separation of about 30 Å. It is difficult to speak of continuous dislocations on size scales much less than this, which may suggest a limit on strength enhancement using dispersion strengthening. However, these numbers also suggest that any dispersion having separation greater than about 300 Å would have little effect on the strength of an Al film. It appears that obstacles in an Al body (grain and subgrain boundaries, other dislocations, work hardening, spatial variance in alloy concentration, etc.) serve to inhibit dislocation motion as well as a dispersion with 300 Å particle separation. Dispersion strengthening thus appears to occur only over a factor of ten or so in particle separation.

The size and density of the nanophase particles making up the dispersion can be greatly affected by the average composition of the material. The nanophase particles making up the dispersion must be large enough to pin the dislocations moving through the matrix. Experiment suggests that a size of ~10 Å is sufficient to effectively pin dislocations, at least in the Al-O system. However, the dislocations must run into the particles as they move through the matrix in order to be pinned. Particles very much smaller than the particle separation tend to be less effective, as significant motion of the dislocations will occur before effective pinning occurs. Increasing the oxygen content of the composite can help to increase the density of the nanophase particles. When the composition of the composite approaches $Al_2O_3$, the properties of the composite become more nearly those of the $Al_2O_3$ (high-strength but brittle), rather than those of the Al matrix (lower-strength but ductile). For dispersion-strengthening to be useful, it seems necessary for both the size of the particles making up the dispersion and the separation of those particles to be within fairly narrow values.

As mentioned above, we have found that the application of an oxygen plasma during growth from an Al deposition source produces films and thicker structures having the correct nanostructure to produce significant dispersion-strengthening. This procedure is now described.

In demonstration of this procedure, electron-beam deposition of Al combined with an oxygen plasma from an Electron Cyclotron Resonance (ECR) source is used to deposit the Al matrix containing $Al_2O_3$ precipitates. The general method, however, is not dependent on either the use of an electron-beam source or the ECR plasma source. Other deposition sources, e.g., resistively heated or gas sources, could be used to provide Al atoms at the growth surface. Similarly, other plasma sources, e.g., RF, DC, and remote-plasma sources, would provide a similar oxygen plasma at the growth surface. The present example is thus of an implementation of the invention, but is not intended to limit the scope of the claims in any way.

A beam of Al atoms and a beam of $O_2^+$ plasma are directed simultaneously on the surface of the growth substrate. The oxygen plasma is accelerated toward the substrate by a bias acting between the plasma source and the substrate. (The bias between the plasma and the substrate may either by a self bias or a bias applied through the use of power supplies external to the source of generation of the plasma.) Average layer compositions ranging from $Al_{0.9}O_{0.1}$ to $Al_2O_3$ have been grown under a wide range of deposition conditions, including variations of Al deposition rate (2–30 Å/sec), of $O_2$ flow rate (0.7–2.5 sccm), pressure (2–7.5×10$^{-5}$ Torr), applied DC bias (0 to −300 V), microwave power (35–150 W), and growth temperatures from 35° C. to 150° C. Note that many of these numbers pertain primarily to the deposition chamber used in our experiments, and may vary significantly in other systems. However, suitable growth conditions for other chambers can be determined without undue experimentation using methods well known in the art.

Layer compositions, thickness, and nanostructure are characterized using techniques well known in the art. The nanostructure characteristic of dispersion-strengthened films having average composition up to about 33% oxygen, or $Al_2O$, is very fine grained fcc Al (grain size about 200 Å), which grains contain a fine dispersion of $\gamma$-$Al_2O_3$ precipitates with an average size of 10–30 Å. The average spacing of the precipitates is about 40–50 Å (generally greater for smaller oxygen concentrations). Such dispersion-strengthened samples have been prepared on Si, Al, or SiO substrates.

A specific set of growth conditions which produce yield strengths of 1.3 GPa follow.

| | |
|---|---|
| Substrate temperature | 100° C. |
| Deposition rate | 10–25 Å/sec |
| DC bias voltage | 0 v |
| Oxygen flow rate | Sufficient to grow films with 20% O content |

The oxygen flow rate and Al source conditions will have to be adjusted for each deposition system. The key is to provide a large enough flux of aluminum atoms incident on the growth surface that an acceptable deposition rate is obtained, and then to provide a sufficiently large flux of oxygen plasma at the growth surface to produce films having the desired average composition. All other parameters can be varied widely, save that the deposition temperature should not greatly exceed 150° C.

The plasma-assisted growth of Al-O alloys offers an approach to the synthesis of thick, high-strength Al-based layers. Such alloy films have a yield strength as much as 3 times that of high-strength bulk Al alloys, approaching the hardness of high-strength steel alloys while retaining much of the elasticity and light weight of the Al metal matrix.

A technique for synthesis of such alloys which is closely related in principle to the oxygen plasma source technique described above, but operates rather differently in detail is the Pulsed Laser Deposition (PLD) technique. In this method, the materials to be deposited are ablated from ablation sources by pulses of high energy laser light, producing short bursts of plasma that in turn impinge on a substrate where they quench and form the deposited layer. The high energy of the atoms in these plasma bursts distinguishes PLD from purely thermal deposition techniques such as e-beam deposition.

To grow dispersion-strengthened Al-O alloy films, a pair of ablation targets is used, specifically Al and $Al_2O_3$. Deposition is done at room temperature in ultrahigh vacuum, so that a very low deposition pressure (~10$^{-9}$ Torr) can be used. The Al-O alloy layers are formed by ablating Al for x laser shots, switching to the $Al_2O_3$ target for y shots, then back to Al and repeating until the film is grown. The ratio x:y controls the atomic composition of the film, while the total number of shots determines the final thickness. Techniques for setting these growth parameters are known in the state of the art. The geometry of the sources and substrate is defined so that each laser pulse deposits a small enough amount of material (sometimes less than one atomic layer per shot) that the final material is uniform in composition. Note that gradients in composition may be obtained by slow variation of the x:y ratio during growth.

A further set of implementations of this class of techniques for producing dispersion-strengthened films would use, e.g., a nitrogen plasma together with a Ti or Al film to form a suitable dispersion of nanophase particles. The principle of growth and formation are essentially the same, thus very similar techniques for film growth may be applied.

We claim:

1. A process for producing a ceramic-metallic composite comprising a dispersion of ceramic particulates in a metallic matrix, said dispersion serving to strengthen said metallic matrix, said process comprising:
   a) generating a gaseous flux of metal atoms less than ten meters from a growth surface;
   b) generating a flow of ceramic-forming plasma less than ten meters from a growth surface;
   c) maintaining the temperature of the growth surface at less than about 150° C.;
   d) restricting the combined partial pressures of the gaseous flux of metal atoms and of the flow of ceramic-forming plasma to about 2 to $7.5 \times 10^{-5}$ Torr within the reaction vessel;
   e) directing said gaseous flux of metal atoms and said flow of ceramic-forming plasma onto the growth surface;
   thereby depositing metal atoms to form solid metal on the growth surface and causing the growth of nanophase ceramic precipitates within the metal matrix.

2. The process of claim 1 further comprising energizing the ceramic-forming plasma using an applied electric field.

3. The process of claim 1 wherein the metal atoms include aluminum atoms, the ceramic-forming plasma comprises atomic oxygen, the ceramic particulates consist of aluminum and oxygen, and the metallic matrix consists of aluminum.

4. The process of claim 3 wherein the rate at which the aluminum atoms are directed to the growth surface is sufficient to grow thereon, at a rate between 1 and 100 Å/second, the ceramic-metallic composite.

5. The process of claim 3 wherein the rate at which the ceramic-forming plasma is directed to the growth surface is sufficient to grow thereon the ceramic-metallic composite, such that said ceramic-metallic composite has an average oxygen content between 5 and 33 atomic percent.

6. The process of claim 3, further including maintaining the temperature of the growth surface between 35° and 150° C.

7. The process of claim 3, further including maintaining the temperature of the growth surface between 80° and 150° C.

8. The process of claim 3, further comprising generating said ceramic-forming plasma by irradiating an $Al_2O_3$ ablation target with a laser.

9. The process of claim 1, wherein the dispersion of ceramic particulates in a metallic matrix is characterized by average separation between particulates of 30 Å to 300 Å.

10. The process of claim 1, wherein the dispersion of ceramic particulates in a metallic matrix is characterized by average particulate size of 10 Å to 200 Å.

11. A process for depositing on a growth surface a layer of ceramic-metallic composite comprising a dispersion of ceramic particulates in a metallic matrix, said dispersion serving to strengthen said composite relative to the intrinsic strength of the metallic matrix, said process comprising:
   a) controlling the temperature of the growth surface to be less than about 150° C.;
   b) creating a first plasma through the action of a laser pulse on metallic ablation target, direction the first plasma onto the growth surface, whereupon a portion of the first plasma forms a solid component; then
   c) creating a second plasma through the action of a laser pulse on a ceramic ablation target, and directing the second plasma pulse onto the solid metal component; and
   thereby forming on the growth surface the layer of ceramic-metallic composite.

12. The method of claim 11, wherein the ceramic particulates have an average separation between 30 Å and 300 Å and an average size between 10 Å and 200 Å.

13. The method of claim 11, wherein the metallic ablation target comprises aluminum.

14. The method of claim 11, wherein the ceramic ablation target comprises alumina.

15. The method of claim 11, wherein steps b), c), and d) are repeated to form a multilayer ceramic-metallic composite which is substantially strengthened relative to the intrinsic properties of the metallic matrix.

* * * * *